United States Patent [19]

Groves

[11] Patent Number: 4,569,879
[45] Date of Patent: Feb. 11, 1986

[54] MOISTURE-RESISTANT HOT-TACKIFYING ACRYLIC ADHESIVE TAPE

[75] Inventor: James D. Groves, Hudson, Wis.

[73] Assignee: Minnesota Mining and Manufacturing Company, Saint Paul, Minn.

[21] Appl. No.: 445,865

[22] Filed: Dec. 6, 1982

[51] Int. Cl.⁴ .............................................. B32B 27/14
[52] U.S. Cl. .................................... 428/198; 428/209; 428/352; 428/353; 428/354; 428/356; 428/449; 428/450; 428/451; 428/452
[58] Field of Search ............... 428/343, 344, 352, 353, 428/354, 355, 356, 447, 450, 451, 452, 449, 196, 198, 209; 526/279, 271

[56] References Cited

U.S. PATENT DOCUMENTS

| | | | |
|---|---|---|---|
| 3,306,800 | 2/1967 | Plueddemann | 156/329 |
| 3,475,213 | 10/1969 | Stow | 428/328 |
| 3,558,574 | 1/1971 | Doehnert . | |
| 3,718,495 | 2/1973 | Tomita | 428/500 |
| 3,762,946 | 10/1973 | Stow et al. | 428/356 |
| 3,778,306 | 12/1973 | Stow | 428/356 |
| 4,112,213 | 9/1978 | Waldman | 428/355 |
| 4,196,254 | 4/1980 | Puskadi | 428/355 |

*Primary Examiner*—Edith Buffalow
*Attorney, Agent, or Firm*—Donald M. Sell; James A. Smith; Gerald F. Chernivec

[57] ABSTRACT

Hot-tackifying tape, the adhesive layer of which is virtually nontacky at 20° C. but forms strong bonds to inorganic substrates at elevated temperatures, which bonds have surprisingly good resistance to prolonged exposure to high humidity and high temperatures. The adhesive layer is an acrylic-silane interpolymer of primarily acrylic ester monomer interacted with an organosilane, which interpolymer has a $T_g$ of $-10°$ to $80°$ C.

16 Claims, 7 Drawing Figures

MOISTURE-RESISTANT HOT-TACKIFYING ACRYLIC ADHESIVE TAPE

TECHNICAL FIELD

The invention concerns heat-activatable adhesive tapes that can be wound up in roll form for convenience in storage and use, especially tapes having adhesive layers which contain electrically-conductive particles.

BACKGROUND ART

The adhesive tape of almost every heat-activatable adhesive tape now on the market has a rather narrow melting point range. Such a tape is called a "hot-melt" adhesive tape, because its adhesive layer is melted at the bonding temperature. At temperatures within 10° C. below the bonding temperature, the adhesive may not even be tacky. Because the adhesive has virtually no strength at the bonding temperature, a clamp may be used until a strong bond develops, either by cooling or by curing. If the bond is later heated to a temperature at or above the bonding temperature, the bond fails unless the adhesive has become cured, e.g., by crosslinking. If the adhesive becomes cured when heated, the tape tends to have a limited shelf life, especially if stored in ordinary warehouses which may become quite hot during the day.

Pressure-sensitive adhesive tapes provide immediate bonding strength ("wet-grab") and the bonds tend to retain good strength at moderately elevated temperatures, but may weaken to the point of failure at higher temperatures. An adhesive which is virtually nontacky at 20° C. or other ordinary room temperatures may become pressure-sensitive and provide immediate bonding strength at elevated temperatures. Such an adhesive may be called a "hot-tackifying" adhesive. When later subjected to temperatures at or somewhat above the bonding temperature, adequate bond strength is retained.

Hot-tackifying adhesives are particularly useful in tape constructions disclosed in U.S. Pat. No. 3,718,495 (Tomita) and U.S. Pat. No. 3,475,213 (Stow). The Tomita tape has a heat-shrinkable backing which when heated shrinks tightly around an object onto which it has been wrapped. Upon prolonged exposure to elevated temperatures, an ordinary pressure-sensitive adhesive can become so soft that the outermost wrap may become loose. Hot-tackifying adhesives are more resistant to softening at elevated temperatures. The tape of the Stow patent has an electrically-conductive backing and an adhesive layer containing electrically-conductive metal particles which preferably are flattened and may comprise from 0.1 to 40 volume percent of the adhesive layer. When applied to electrical conductors such as are on one face of a printed circuit board, the particles conduct electricity between the conductors and the backing. If the adhesive were to become soft when heated, as by electricity flowing through the metal particles, the particles would be able to move about, gradually resulting in increased electrical resistance unless the assembly has a permanent clamp, but this can be awkward and expensive.

A preferred class of "hot-tackifying" adhesives is provided by copolymers of alkyl acrylates and/or methacrylates and copolymerizable monomers having strongly polar groups such as acylic acid, itaconic acid, acrylonitrile, and acrylamide. When those hot-tackifying adhesive tapes are heated and applied to inorganic substrates (e.g., glass, ceramic, metal), the bonds tend to fail upon prolonged exposure to high humidity at elevated temperatures.

DISCLOSURE OF INVENTION

The invention concerns a hot-tackifying adhesive tape which, like prior hot-tackifying adhesive tapes, has a flexible, heat-resistant backing and an adhesive layer which is virtually nontacky at 20° C. Its adhesive layer, like those of the prior tapes, comprises an acrylic polymer of primarily at least one alkyl acrylate and/or methacrylate ester monomer (here called "acrylic ester monomer") such as ethyl acrylate. As in the prior art, the acrylic ester monomer may be copolymerized with at least one copolymerizable monomer having a polar group such as acrylic acid, methacrylic acid, itaconic acid, maleic acid or anhydride, the amides of said acids, acrylonitrile, methacrylonitrile, and N-vinyl-2-pyrrolidone. The copolymerizable polar monomer may comprise up to about 50 mol percent of the total monomers. Other copolymerizable monomers may also be employed in various amounts without detracting from the value of the acrylic polymer for the purposes of the invention. Among such copolymerizable monomers are styrene, vinyl acetate and vinyl chloride, which when used are preferably used in amounts up to about 5 mol percent of the total monomers.

Also like prior hot-tackifying adhesives tapes, the acrylic polymer should have a $T_g$ (glass transition temperature) or a weight-averaged $T_g$ of $-10°$ to 80° C. If the $T_g$ were below $-10°$ C., the adhesive layer might not form bonds having desirably high strength at elevated temperatures, but if above 80° C., bonding temperatures might be undesirably high and the bonds might be unduly brittle at cold temperatures.

The novel hot-tackifying acrylic adhesive tape of this invention differs from prior tapes in that it forms bonds to inorganic substrates that exhibit surprisingly good resistance to failure upon prolonged exposure to high humidity (e.g., 95% RH) at elevated temperatures (e.g., 80° C), because the acrylic polymer has an interacted functionally reactive organosilane coupling agent in an amount of at least 0.2 part per 100 parts by weight of total monomer. Below about 0.2 part that surprising result is not attained. Best results are attained at about 0.5 to 4 percent. Larger amounts are considered wasteful and might cause short hot life.

The organosilane may be interpolymerized with the acrylic ester monomer, with or without other copolymerizable monomers, or it may be reacted with functional groups on the backbone of an acrylic polymer. Either process results in what is hereinafter called an "acrylicsilane interpolymer".

The organosilane has the general formula $R_{(4-n)}SiX_n$, where X is a hydrolyzable group such as ethoxy, methoxy, or 2-methoxy-ethoxy; R is a monovalent organic radical of from 1 to 12 carbon atoms which contains a functional organic group such as mercapto, epoxy, acrylyl, methacrylyl, or amino; and n is an integer of from 1 to 3.

As is known in the art, the organosilane can cause solutions of polymers to gel, so that it may be desirable to employ an alcohol or other known stabilizers. When the organosilane is to be copolymerized with the other monomer, a stabilizer should be selected that does not interfere with the polymerization. Methanol is especially useful and is preferably employed in amounts from about twice to about four times the amount of the organosilane.

Acrylic ester monomers especially useful for making the acrylic-silane interpolymer are those which homopolymerize to a $T_g$ of at least $-10°$ C., including methyl acrylate, methyl methacrylate, ethyl methacrylate, propyl methacrylates, butyl methacrylates, bornyl acrylates, bornyl methacrylates, 2-phenoxyethyl acrylate, 2-phenoxyethyl methacrylate, the mono- and dimethyl and ethyl esters of itaconic acid, and the mono- and di- methyl and ethyl esters of maleic acid. Useful acrylic ester monomers which provide reduced $T_g$ include ethyl, butyl and octyl acrylates, and n-amyl, hexyl and octyl methacrylates.

When heated about 50° C. above its $T_g$, the adhesive layer becomes sufficiently tacky to form useful bonds with applied pressure. Bonds are more readily made at higher temperatures, preferably about 80° C. to 100° C. above the Tg.

THE DRAWING

In the drawing which schematically illustrates a number of tapes embodying the invention:

Figure 1:
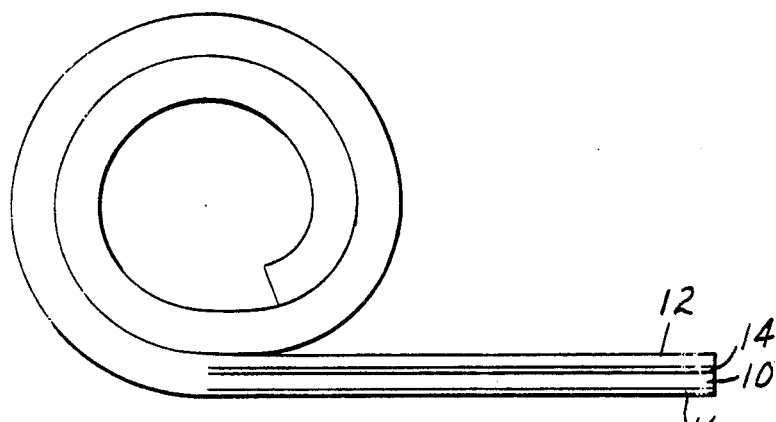
FIG. 1 shows a roll of one embodiment and an edge of an unwound portion.

The tape of FIG. 1 has a backing 10, a hot-tackifying adhesive layer 12, an adhesion-promoting primer coating 14, and a low-adhesion backsize coating 16. The backing 10 may be a plastic film which may be heat-shrinkable or may be paper. If the backing had a release surface or layer instead of the primer coating 14, the adhesive layer 12 could be removed from the backing for use as a transfer adhesive.

Figure 2:
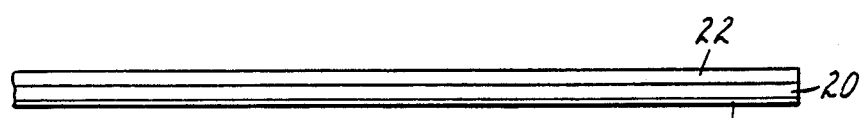
FIG. 2 is an edge view of a second embodiment.

The tape of FIG. 2 has a fibrous backing 20 such as paper, cloth or a carded, heat-fused web and a hot-tackifying adhesive layer 22 directly in contact with the backing. Because of the fibrous nature of the backing 20, the adhesive may become mechanically interlocked into interstices of one face of the backing, so that no adhesion-promoting primer layer is necessary. However, a low-adhesion backsize coating 26 (or a disposable liner, not shown) prevents the adhesive layer 22 from becoming mechanically interlocked with the other face of the fibrous backing 20 when the tape is wound upon itself into roll form.

Figure 3:
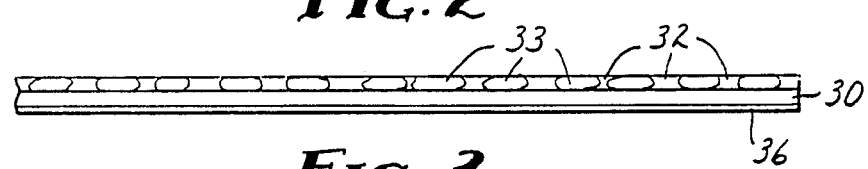
FIG. 3 is an edge view of a third embodiment.

The tape of FIG. 3 has an electrically-conductive metal foil backing 30 carrying a layer of hot-tackifying adhesive 32 containing a plurality of electrically-conductive metal particles 33 which preferably are flat as indicated and may have a thickness approximating the overall thickness of the adhesive layer 32. Tapes containing such particles are taught in the aforementioned U.S. Pat. No. 3,475,213. No adhesion-promoting primer layer is required inasmuch as the hot-tackifying adhesive layer of the invention tends to adhere strongly to metal backings, but there is a low-adhesion backsize coating 36 to permit unwinding from a roll.

Figure 4:
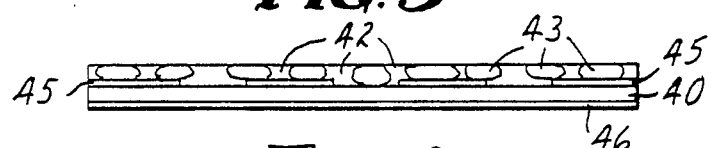
FIG. 4 is an end view of a fourth embodiment.

The tape of FIG. 4 has a plastic film backing 40 and a layer of hot-tackifying adhesive 42 containing flat electrically-conductive metal particles 43 comparable to the metal particles 33 of FIG. 3. The adhesive face of the backing 40 bears four electrically-conductive stripes 45 which may be metal and preferably are thin films and hence of negligible thickness. The opposite face of the backing 40 has a low-adhesion backsize coating 46.

Figure 5:
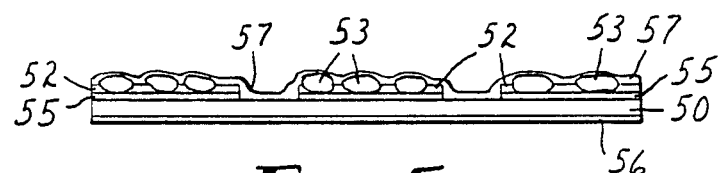
FIG. 5 is an end view of a fifth embodiment.

The tape of FIG. 5 has a plastic film backing 50 bearing three electrically-conductive stripes 55 similar to those of the tape of FIG. 4. Applied over each of the stripes 55 is a stripe of hot-tackifying adhesive 52 containing flat electrically-conductive metal particles 53, the thicknesses of which approximate twice the average dried thickness of the stripes of the adhesive 52. Applied over the adhesive 52 and the spaces between the stripes is a layer of unfilled hot-tackifying adhesive 57, the dried thickness of which approximates that of the adhesive 52. The uncoated face of the backing 50 has a low-adhesion backsize coating 56. When the tape of FIG. 5 is heated to a temperature at which the adhesive 57 becomes tacky and is laid against a rigid electrical conductor, pressure against the backing 50 produces electrical contact between the conductor and the conductive stripes 55, the excess adhesives 52 and 57 flowing into the spaces between the stripes.

Figure 6:
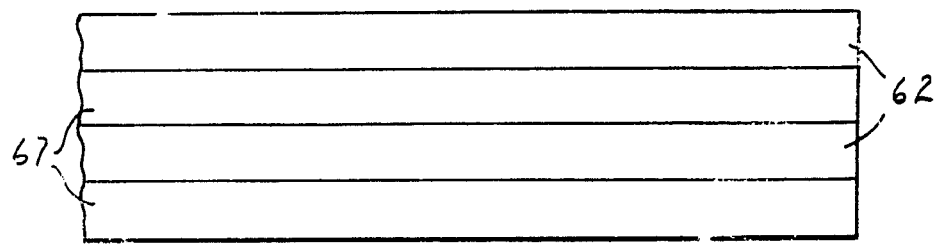
FIG. 6 shows the adhesive face of a sixth embodiment.

FIG. 6 shows the face of a tape having alternating longitudinal stripes of a hot-tackifying adhesive 62 and an ordinary pressure-sensitive adhesive 67 carried by a backing (not shown). The pressure-sensitive adhesive provides immediate bonding at room temperature, and the strength of the bond is appreciably increased by heating to a temperature at which the adhesive 62 becomes aggressively tacky. The heat-activated bond provided by the hot-tackifying adhesive 62 retains good strength upon subsequent exposure to temperatures at or somewhat above its bonding temperature. Instead of longitudinal stripes, the two types of adhesive could be applied in any desired pattern.

Figure 7:
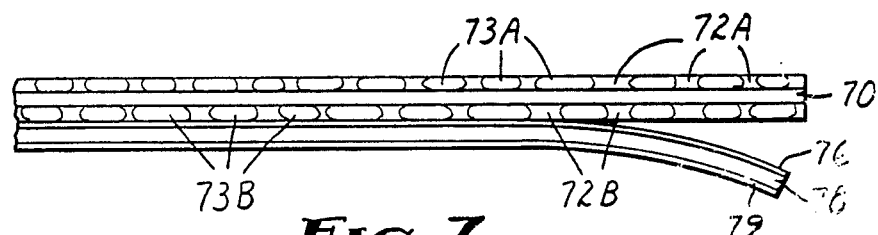
FIG. 7 is an edge view of a seventh embodiment.

FIG. 7 shows the edge of a tape having an electrically-conductive metal foil backing 70 and two layers of hot-tackifying adhesive 72A and 72B, each containing flat electrically-conductive metal particles 73A and 73B, respectively. The double-coated metal foil backing is supported by a disposable carrier web 78 which has low-adhesion surfaces, such as may be provided by a pair of low-adhesion coatings 76 and 79, and is shown being stripped away.

90° Static Peel Value

One-half-inch by 3-inch (1.27 by 7.62 cm) test specimens are bonded in a heated platen press by their adhesive layers to glass plates, leaving one inch (2.54 cm) of each specimen unbonded. The platens are heated to 200° C., and 200 psi (1378 kPa) is applied for ten seconds. The actual temperature to which the adhesive is heated may be 40 or 50° C. below the platen temperature. The glass plates are immediately positioned horizontally in a test fixture, a 100-gram weight is hung from the unbonded portion of the specimen, and the fixture is placed in a humidity chamber at 80° C. and 95% R.H. The time for the weight to fall is recorded as the 90° Static Peel Value. All reported values are averages of at least three specimens.

180° Dynamic Peel Value

Specimens prepared in the same manner as for the 90° Static Peel Value are tested for 180° peelback on a Twing Albert tensile tester ("Intelect 500") at a jaw separation rate of 0.1 inch/min (0.25 cm/min). Initial values are determined within 30 minutes at room temperature. After being held in a humidity chamber, the specimens are removed and tested within 30 minutes at room temperature. All reported values are averages of at least three specimens.

Acrylic-silane Interpolymer A

To a 250 ml polyethylene bottle was charged 22.4 g of ethyl acrylate, 31.36 g of methyl acrylate, 1.68 g of acrylamide, 0.56 g of gamma-methacryloxypropyl-trimethoxysilane, 0.112 g of azobis(isobutyronitrile) and 144 g of ethyl acetate. (Based on solids weight the monomer charge consisted of 36.5 mol percent ethylacrylate, 59.3 mol percent methylacrylate, 3.8 mol percent acrylamide, and 0.4 mol percent of the functionally reactive organo silane.) The bottle was purged three times with nitrogen, capped and placed in a water bath at 60° C. for about 16 hours. The percent conversion of monomers to polymer was determined by infrared spectrophotometric analysis to be 98.8. The weight-average $T_g$ of the polymer was 0° C. The inherent viscosity was 1.49 determined using 0.1 g of polymer in 100 ml of ethyl acetate.

Acrylic-silane Interpolymers B–H

The same polymerization procedure was followed as in making Acrylic-silane Interpolymer A except as indicated in Table I, and the organosilane used in making Acrylicsilane Interpolymer D was gamma-methacryloxypropyl-tris(2-methoxyethoxy) silane.

TABLE I

|  | B | C | D | E | F | G | H |
|---|---|---|---|---|---|---|---|
| Methyl acrylate (g) | 47.4 | 31.02 | 31.36 | 29.5 | 29.5 | 45.6 | 45.6 |
| Methyl methacrylate (g) | 9.0 | 31.02 |  | 1.5 | 1.75 | 13.8 | 14.1 |
| Ethyl acrylate (g) |  |  | 22.4 | 18.5 | 18.5 |  |  |
| Acrylamide (g) | 3.0 | 2.3 | 1.4 |  |  |  |  |
| Organosilane (g) | 0.6 | 0.66 | 0.84 | 0.5 | 0.25 | 0.6 | 0.3 |
| Azobis(isobutyronitrile)(g) | 0.12 | 0.132 | 0.112 | 0.1 | 0.1 | 0.12 | 0.12 |
| Ethyl acetate (g) | 140 | 134 | 144 | 150 | 150 | 140 | 140 |
| Bath temperature (20 C.) | 53 | 53 | 60 | 63 | 63 | 53 | 53 |
| time (hours) | 20 | 20 | 16 | 16 | 16 | 20 | 20 |
| Conversion to polymer (%) | 97.6 | 96.4 | 98.3 | 100 | 99.8 | 99.8 | 98.9 |
| Inherent viscosity | 1.29 | 1.12 | 1.48 | 1.485 | 1.45 | 1.50 | 1.46 |
| Approx. $T_g$ (°C.) | 30 | 60 | 0 | 0 | 0 | 30 | 30 |

Acrylic-silane Interpolymer I

A 500 ml polyethylene bottle was charged with 18.48 g of ethyl acrylate, 32.64 g of methyl acrylate, 4.5 g of methyl methacrylate, 0.392 g of isocyanatoethyl methacrylate, 0.112 g of azobis(isobutyronitrile) and 144 g of ethyl acetate. (Based on solids weight the monomer charge consisted of 30.3 mol percent ethyl acrylate, 62.0 mol percent methyl acrylate, 7.4 mol percent methyl methacrylate, and 0.4 mol percent isocyanatoethyl methacrylate.) After purging three times with nitrogen, the bottle was capped and placed in a constant temperature bath at 53° C. for 24 hours. To the resulting polymer solution was added 2.2 g of gamma-aminopropyl-triethoxysilane in 90 g of ethyl acetate in four additions over a period of 2 hours. The mixture was shaken for an additional 10 hours. No gellation was evident after this time. An infrared spectrum of the polymer solution showed a 96.9 percent conversion of monomer to polymer and no isocyanate group. Inherent viscosity, 1.48; $T_g$, 0° C.

Acrylic-silane Interpolymer J

The 2-step procedure used in making Acrylic Copolymer I was followed using a charge of 18.48 g of ethyl acrylate, 32.88 g of methyl acrylate, 4.48 g of methyl methacrylate, 0.168 g of acrylic acid, 0.112 g of azobis(isobutyronitrile), and 144 g of ethyl acetate. (Based on solids weight, the monomer charge consisted of 30.1 mol percent ethyl acrylate, 62.2 mol percent methyl acrylate, 7.3 mol percent methyl methacrylate, and 0.4 mol percent acrylic acid.) After 24 hours at 53° C., was added 2.4 g of gamma-glycidoxypropyltrimethoxysilane in 90 g of ethyl acetate. After shaking for about 72 hours, no gellation was evident, and an infrared spectrum of the polymer solution showed a 97.9 percent conversion of monomer to polymer Inherent viscosity, 1.37; $T_g$, 0° C.

EXAMPLES 1–10

Each of the solutions of Acrylic-silane Interpolymers A–J was diluted with ethyl acetate to easily coatable viscosities within the range of 2,000 to 10,000 cps (Brookfield). Percent solids of each was 15–20% by weight. Using a knife coater at a knife setting of 0.15 mm each was coated onto a nonwoven web ["Webril" Grade 1302, 27 g/yd² (32 g/m²), Kendall Fiber Products Div.]of drawn polyethylene-terephthalate fibers which had previously been saturated with a rubbery thermoset acrylic resin. After 15 minutes at 80° C. in an air-circulating oven to dry the coating, an identical second coating was applied over the first to provide a total dry coating thickness of 0.06 mm. 180° Dynamic Peel Values are reported in Table II for the tapes of Examples 1–10, together with Comparative Examples 1(c) and 2(c) which were identical to Examples 1 and 2, respectively, except for omission of the organosilane when making the acrylic polymers.

TABLE II

| | | 180° Dynamic Peel Values in Newtons per dm width | | | | |
|---|---|---|---|---|---|---|
| Ex. No. | Acrylic-Silane Interpolymer | Initial | After aging at 80° C., 95% R.H. | | | |
| | | | 24 hr. | 200 hr. | 600 hr. | 1000 hr. |
| 1 | A | 74 | 166** | 149** | 124 | 70 |
| 1(c) | | 26 | 0 | NT | NT | NT |
| 2 | B | 119 | 145** | 105* | 93* | 105* |
| 2(c) | | 0 | NT | NT | NT | NT |
| 3 | C | 82* | 89* | 94* | 91* | 81* |
| 4 | D | 39 | 95 | 73 | 58 | 44 |
| 5 | E | 77 | 123** | 82* | 80* | 63* |
| 6 | F | 54 | 109* | 105** | 65* | 49** |
| 7 | G | 119* | 61* | 60* | 60* | 57* |
| 8 | H | 106 | 79* | 65* | 64* | 58* |
| 9 | I | 67 | 142 | 132* | 110* | 107* |
| 10 | J | 60 | 137 | 154* | 169* | 179* |

NT = not tested
Failures, adhesive except as indicated by:
*cohesive or backing failure
**combined adhesive and cohesive or backing failure Each of the tapes of Examples 1–4, 9 and 10 had a 90° Static Peel Value exceeding 240 minutes, at which point the test was discontined. The tape of Example 1(c) failed at 0.22 min. and the tape of Example 2(c) failed at less than 0.1 min. Examples 5–8 were not tested.

EXAMPLE 11

A hot-tackifying tape of the invention was made using as the backing biaxially-oriented polyethylene terephthalate film of 25 micrometers thickness which had been heat-treated to develop superior thermal dimensional stability. Metallic silver stripes were applied by vapor deposition to a thickness of 25 nm and a width of 0.89 mm on 1.78 mm centers.

The solution of Acrylic-silane Interpolymer A was diluted with ethyl acetate to a coatable viscosity and then mixed with flattened silver metal particles having diameters from 76 to 102 micrometers and thicknesses about 25 micrometers. The particles comprised about 8% by volume of the mixture which was coated through a mask in stripes in register with the vapor-deposited silver stripes. Each adhesive stripe was about 13 micrometers in thickness after drying. Then the unfilled coatable solution of Acrylic Copolymer A was coated uniformly over the entire striped face and dried to a thickness of about 13 micrometers. This was slit into tapes having a width of 2.54 cm, each tape having ten silver metal stripes and matching silver-particle-filled adhesive stripes. The tapes were wound upon themselves into rolls.

A piece of the tape 3.7 cm in length was applied to an unheated printed circuit board using a press, the moving platen of which was preheated to 170° C. Each pair of stripes of the tape matched a conductive lead on the face of the circuit board (adhered length 0.6 cm). A pressure of 1340 kPa/cm² was applied for 5 seconds. The other end of the piece of tape was applied in the same way to an unheated indium-tin oxide coating on glass (adhered length 0.32 cm). The pressure in each case reduced the overall adhesive thickness to less than the thicknesses of the silver metal particles, thus creating an electrically-conductive path between the indium-tin oxide coating and each conductor of the printed circuit. After cooling to room temperature, the average resistance in each such path was 50 ohms. After 1000 hours at 90° C., the resistance had not increased.

EXAMPLE 12

The solution of Acrylic-silane Interpolymer B was diluted with ethyl acetate to 15.5% solids. Then 1.9 part of disalicylalpropylene diamine and 2.3 parts of antioxidant per 100 parts of adhesive solids were added. This was coated onto dead-soft rolled copper foil (305 g/m²), dried, and interleafed with a carrier web having low-adhesion surfaces.

The carrier web was peeled off and substituted by a similar carrier web which was held in a taut condition and joined to the adhesive layer between the nip of two heated steel rolls. The roll contacting the carrier web was smooth, and the other roll had an embossing pattern consisting of 2 sets of raised fine lines on centers of 1.59 mm, the 2 sets being at right angles to each other, leaving a pattern of depressed squares on the embossing roll as illustrated in FIG. 3 of U.S. Pat. No. 3,497,383 (Olyphant, Jr. et al.). All the raised lines ran in a direction inclined 45° to the direction of rotation, so that diagonals of the squares were in the direction of rotation. While both rolls were at 249° C., they were pressed together with a gauge pressure of 2800 g/cm² distributed across the 25-cm wide web, thus creating fine lines in the copper foil which reached the surface of the adhesive at the carrier web. The whole was slit to a width of 2.54 cm and wound up for storage. After peeling off the carrier web, the hot-tackifying adhesive layer of a piece of the resulting tape 2.5 inches (6.35 cm) in length was laid against two copper foil specimens such that a one-inch (2.54 cm) length at each end of the tape contacted copper with a 0.5 inch (1.27 cm) gap between the two copper specimens. Bonds to the copper specimens were made on a hot plate at 121° C. under three passes of a hard-rubber roller using full arm pressure. After cooling, the resistance between the two copper foil specimens was 0.2 ohm.

I claim:

1. Hot-tackifying adhesive tape which has a flexible, heat-resistant backing, can be wound upon itself in roll form for convenience in storage and use, and has an adhesive layer which is virtually nontacky at 20° C., said adhesive layer comprising an acrylic-silane interpolymer of primarily acrylic ester monomer interacted with organosilane in an amount of at least 0.2 part per 100 parts by weight of total monomer, which interpolymer has a $T_g$ of $-10°$ to 80° C.

2. Hot-tackifying adhesive tape as defined in claim 1 wherein said acrylic ester monomer is selected from alkyl acrylates and methacrylates having 1-8 carbon atoms in their alkyl groups; bornyl acrylates and methacrylates; 2-phenoxyethyl acrylate and methacrylate; the mono- and dimethyl and ethyl esters of itaconic acid and the mono- and di- ethyl esters of maleic acid.

3. Hot-tackifying adhesive tape as defined in claim 1 wherein said acrylic-silane interpolymer is a polymer of monomers, up to 50 mol % of which is at least one copolymerizable monomer selected from acrylic acid, methacrylic acid, itaconic acid, maleic acid, maleic anhydride, amides of said acids, acrylonitrile, methacrylonitrile, and N-vinyl-2-pyrrolidone.

4. Hot-tackifying adhesive tape as defined in claim 3 wherein styrene, vinyl acetate and vinyl chloride comprise up to 5 mol % of the total monomers.

5. Hot-tackifying adhesive tape as defined in claim 1 wherein the amount of organosilane is from 0.5 to 4 parts per 100 parts by weight of total monomer.

6. Hot-tackifying adhesive tape as defined in claim 1 wherein the backing is a plastic film which is heat-shrinkable in the lengthwise direction.

7. Hot-tackifying adhesive tape as defined in claim 1 wherein said backing is a conductive metal foil, the adhesive layer is in contact with one face of the metal foil, and there is a low-adhesion backside coating on the other face of the metal foil.

8. Hot-tackifying adhesive tape as defined in claim 1 wherein said backing is an electrically-conductive metal foil, and a carrier web having low-adhesion surfaces protects the adhesive layer.

9. Hot-tackifying adhesive tape as defined in claim 8 wherein the foil extends in a pattern of lines and/or dots to the surface of the adhesive layer which becomes exposed upon removal of the carrier web.

10. Hot-tackifying adhesive tape as defined in claim 1 wherein said backing is a fibrous web and the adhesive is mechanically interlocked with the fibers at one face of the backing.

11. Hot-tackifying adhesive tape as defined in claim 1 wherein the adhesive is filled with electrically-conductive particles comprising 0.1 to 40 volume percent of the adhesive layer.

12. Hot-tackifying adhesive tape as defined in claim 11 wherein said backing is a plastic film, and a plurality of narrow, parallel electrically-conductive stripes overlay the plastic film and underlay and contact said adhesive layer.

13. Hot-tackifying adhesive tape as defined in claim 12 wherein said adhesvie layer is in stripes overlying each electrically-conductive stripe, and a second unfilled hot-tackifying adhesive layer covers the adhesive stripes and the spaces therebetween, the electrically-conductive particles having thicknesses approximating the total thickness of the two adhesives.

14. Hot-tackifying adhesive tape as defined in claim 1 wherein said backing has low-adhesion surfaces so that the adhesive layer can be removed from the backing.

15. Hot-tackifying adhesive tape as defined in claim 1 wherein said adhesive layer consists of spaced stripes of said one or more polymers.

16. Hot-tackifying adhesive tape as defined in claim 15 wherein the spaces between said spaced stripes are filled with stripes of a pressure-sensitive adhesive.

* * * * *